US010729031B1

(12) United States Patent  
Wu (10) Patent No.: US 10,729,031 B1  
(45) Date of Patent: Jul. 28, 2020

(54) CONTROL SYSTEM COMPRISING MULTIPLE FUNCTIONAL MODULES AND ADDRESSING METHOD FOR FUNCTIONAL MODULES THEREOF

(71) Applicant: Dinkle Enterprise Co., Ltd., New Taipei (TW)

(72) Inventor: Shang-Tsai Wu, New Taipei (TW)

(73) Assignee: DINKLE ENTERPRISE CO., LTD., New Taipei (TW)

( * ) Notice: Subject to any disclaimer, the term of this patent is extended or adjusted under 35 U.S.C. 154(b) by 0 days.

(21) Appl. No.: 16/659,654

(22) Filed: Oct. 22, 2019

(30) Foreign Application Priority Data

Apr. 15, 2019 (TW) .............................. 108113095 A (51) Int. Cl.
| | | |
|---|---|---|
| *H04B 10/27* | (2013.01) | |
| *H04L 12/40* | (2006.01) | |
| *H05K 7/14* | (2006.01) | |
| *H04B 10/40* | (2013.01) | |
| *H04B 10/29* | (2013.01) | |
| *G06F 1/18* | (2006.01) | |

(52) U.S. Cl.
CPC ........... *H05K 7/1475* (2013.01); *G06F 1/185* (2013.01); *H04B 10/27* (2013.01); *H04B 10/29* (2013.01); *H04B 10/40* (2013.01); *H04L 12/40006* (2013.01); *H05K 7/1465* (2013.01); *H05K 7/1474* (2013.01)

(58) Field of Classification Search
None
See application file for complete search history.

(56) References Cited

U.S. PATENT DOCUMENTS

| 5,604,872 A | * | 2/1997 | Abert | G06F 12/0661 |
| | | | | 710/301 |
| 5,716,241 A | * | 2/1998 | Hennemann | G06F 1/184 |
| | | | | 439/716 |
| 6,496,892 B1 | * | 12/2002 | Lake | G05B 19/0423 |
| | | | | 710/301 |
| 7,704,079 B2 | * | 4/2010 | Weiss | H01R 13/6598 |
| | | | | 439/65 |
| 2004/0195078 A1 | * | 10/2004 | Anderson | B65G 43/08 |
| | | | | 198/781.05 |
| 2005/0089027 A1 | * | 4/2005 | Colton | H04Q 11/0005 |
| | | | | 370/380 |
| 2016/0318714 A1 | * | 11/2016 | Reischl | G05B 19/0426 |
| 2016/0359741 A1 | * | 12/2016 | Cooper | B61L 15/0072 |
| 2019/0123828 A1 | * | 4/2019 | Hellstrom | G06F 13/4063 |
| 2019/0278341 A1 | * | 9/2019 | Wu | H04L 12/40032 |

\* cited by examiner

*Primary Examiner* — Li Liu (74) *Attorney, Agent, or Firm* — Bacon & Thomas, PLLC (57) ABSTRACT

In a system comprising plural functional modules including a control module, the functional modules being aligned closely one next to another and electrically connected to a bus, an addressing method for the functional modules comprises the steps of:

The control module sends a photo addressing command comprising a unique address to its downstream functional module.

The downstream functional module records the address as its address and sends a next addressing command to a further downstream functional module and a response signal to the control module.

Repeat this step, until no response signal is received.

28 Claims, 6 Drawing Sheets

CONTROL SYSTEM COMPRISING MULTIPLE FUNCTIONAL MODULES AND ADDRESSING METHOD FOR FUNCTIONAL MODULES THEREOF

TECHNICAL FIELD

The present invention relates to a novel structure of a control system comprising a plurality of functional modules, and more particularly to an addressing structure and addressing method of such a system. The present invention provides an optical signal-based method for addressing the functional modules in the system, whereby re-addressing of the functional modules can be easily and rapidly implemented, when one functional module is added into or removed from the system.

BACKGROUND OF THE INVENTION

The terminal box (or terminal block) is a type of functional module commonly used in the industry, in particular in forming a control system that includes a plurality of terminal boxes. A terminal box generally provides a casing and one or more circuit boards enclosed therein, to form one or multiple functional module. Each functional module is connected to a particular working machine, to control the operations of the working machine. In a factory, dozens to hundreds of working machines may be used, and each working machine may be connected to one or more functional modules. These functional modules combine into one system, referred to as a control system. In such a control system, the main function of the terminal boxes is to provide horizontal communication between/among functional modules. That is, to provide transmission of electrical power, data, and control signals between/among different functional modules.

The connections between/among terminal boxes are realized by electrical contacts provided on the casing, that allow electrical power, data and signals to travel between two functional boxes. The known technology also provides a photo Transceiver module for optical communication between a functional module in one terminal box and a functional module in another terminal box. To simplify the connection and communication between/among terminal boxes in a system, the known art also provides a longitudinal support rail, to which a plurality of terminal boxes can be affixed, using the clamping mechanism provided at the bottom of the terminal boxes. The support rail allows the terminal boxes to align closely one adjacent to another, so that the electrical contacts on the sides of the terminal boxes form a reliable connection. US Patent Publication No. US 2013/237067A1 discloses a "Data bus structure for terminal blocks and terminal blocks using the same," that further provide a bus structure in the support rail, whereby the plurality of terminal boxes can share power, data, and control signals via the bus structure.

The conventional terminal box provides electrical contacts for power lines, data lines, and signal lines electrical contacts on the box body. There are two groups of electrical contacts provided on each box body, which are respectively arranged on both sides of the box body, symmetrically with each other. When all functional modules are arranged in series, for example, aligned side-by-side on the above-mentioned support rail, the electrical contacts on one side of a specific terminal box will contact the electrical contacts on the corresponding side of an adjacent other terminal box of the side. The electrical contacts on the other side are in turn connected to the electrical contacts on the corresponding side of a third terminal box immediately adjacent to that other side. In order to ensure the formation and stability of the electrical connection, conventional terminal boxes are still required to provide engaging devices so that adjacent two terminal boxes can abut against each other without relative movements. A typical design of such a terminal box can be found in U.S. Pat. No. 5,716,241, title: I/O Device for Data Bus. Connectors that provide contacts in such terminal boxes are commonly referred to as T-shaped electrical terminals, such as those shown in U.S. Pat. No. 7,704,079, title: T-Shaped Shielded Bus Connector. In this connection, all the terminal boxes essentially form a series connection. The lines formed by the concatenation are a "bus;" power, signals, etc. that pass through the lines can be shared by all the terminal boxes.

A control system includes a plurality of terminal boxes. In terms of control, each terminal box can be considered a functional module, although each terminal box may functionally include multiple functional modules. The control system must address or readdress each functional module, i.e. each terminal box, before operation. In other words, before the control system starts to operate, the address or address code of each terminal box (hereinafter collectively referred to as "address") must be assigned or reassigned by a controller or control module, which is usually one of the terminal boxes.

However, terminal boxes currently used in the industry do not usually provide automatic addressing functions. When addressing the terminal boxes of a control system, usually an addressing tool is used to generate a unique address as the "default address" of each terminal box and to write it into the functional module of the terminal box. The address written in is identified as the address of the terminal box during operations thereafter. Another method is the manual addressing. For example, a dip switch is provided on the terminal box for addressing. After the terminal box is placed on a support rail, a number or code is generated according to a certain rule and assigned to the terminal box, as its address at the time of operation.

In U.S. Patent Publication 2004/195078, title: Integrated Conveyor Bed, a method of giving automatic addressing to a concatenated control module is proposed. According to the method, the master module first issues a start signal to the first of the plurality of control modules connected by the "daisy chain." After the first control module returns a response signal, the control module sends a unique communication address assigned to the first control module. Thereafter, the first control sends a start signal to the second control module on the downstream side. The master module sends another unique communication address in response to the response signal. The above addressing operation is repeated until all the control modules of the system have been assigned their communication addresses.

U.S. Patent Publication 2016/318714, title: "Method for Addressing/Sequencing Linearly Interlinked Control Components of a Conveying System" provides an improved automatic addressing method. The method includes addressing by a control module to each downstream control module on one direction and addressing each downstream control module in the opposite direction, followed by addressing by a downstream control module in one of the directions in a reversed sequence. The resulted addresses are used as the addresses of all control modules. The method obtains the physical location information of each control module through this process.

A method and apparatus for identifying spatial proximity in a modular system is disclosed in U.S. Pat. No. 10,177, 961. The invention provides a method for addressing a control system containing a plurality of functional modules, comprising: requesting all functional modules to open their photo transmitters (S) and photo receivers (R); receiving status signal of the photo receivers from all functional modules through a communication network; assigning a starting address to the functional module that does not receive an optical signal; turning on the photo transmitter of the functional module that just receives an address assignment; assigning a next address to the functional module that receives the optical signal; repeating the above steps until all functional modules have been assigned an address. A disadvantage of this invention is that it can only be applied to systems in which the functional modules are already correctly aligned. Yet another disadvantage is in that all functional modules need to have a locational address, before they can be addressed.

Taiwan Patent Application No. 107108158 proposes a control system comprising a plurality of functional modules and an addressing method for addressing functional modules thereof. The invention provides an addressing structure and method for assigning functional modules in a control system based on optical signals. The invention facilitates the user to address or readdress a system, when one functional module is removed from or added into the system. The system provides a support rail to ensure that all functional modules are aligned side by side and that their light transceivers are properly aligned. The addressing method comprises the following steps: The control module sends an addressing command to an adjacent functional module in one direction and an address signal to a communication network connected by all the functional modules. The functional module receiving the addressing command picks up the address, uses it as its own address, and sends an addressing command to its adjacent downstream functional module. The control module sends a next address signal. Repeat the above steps until the addressing is completed.

Taiwan Patent Application No. 107108158 ensures all functional modules are aligned relatively to each other and their optical transceivers are correctly aligned, mainly because the functional modules are affixed to the support rail side-by-side. However, in such a system, sometimes a light emitter can not align to its corresponding receiver, due to, for example, malfunction of the light emitter or receiver. In such a case, the addressing operation cannot be accomplished.

When an addressing operation is interrupted for any reason, it is preferable that the system can readdress or resume the addressing, in addition to simply dragonize reasons of the interruption. Unfortunately, the conventional art does not provide such a solution.

OBJECTIVES OF THE INVENTION

The objective of the present invention is to provide a control system comprising multiple functional modules that can automatically address the functional modules.

Another objective of the present invention is to provide a control system comprising multiple functional modules that can easily readdressed the functional modules.

It is also an objective of the present invention to provide a control system including a plurality of functional modules that, when an addressing operation is interrupted, can determine causes of the interruption and readdress or resume addressing the functional modules.

Another objective of the present invention is to provide a novel method for automated addressing of a plurality of functional modules in a control system comprising the functional modules.

According to the present invention, a control system comprising a plurality of functional modules is provided, wherein the control system comprises at least one group of plural functional modules arranged side-by-side. Each functional module comprises at least one circuit, a casing for accommodating at least a part of the circuit, a communication device in electrical connection with the circuit and in communication connection with a communication channel connected by all the functional modules, and a photo transceiver comprising a photo receiver and a photo transmitter, respectively provided on the sides of the casing, for transmission of optical signals to and from a photo transmitter and a photo receiver on corresponding sides of the casing of adjacent functional modules.

The plurality of functional modules includes a control module, configured to send from its communication device an initialization command to all functional modules via the communication channel, which initialization command causing all functional modules entering an addressing operation. The control module is further configured to send a first addressing command to a first functional module adjacent to a downstream side of the control module via its photo transmitter, after entering the addressing operation.

The first addressing command comprises a unique first address data, and causes the first functional module to receive the first address data, record the address as the address of the first functional module, and send a second addressing command to a second functional module adjacent to the first functional module at the downstream side via its light emitter.

The second addressing command includes a unique second address data, and causes the second functional module to receive the second address data, record the address as the address of the second functional module, and send a next addressing command to an adjacent functional module in the downstream side via its light emitter. The value of the second address data is a function of the first address data value, and the value of the next address data is a function of the second address data value. The function is preferably a cumulative function.

Each functional module is further configured to, after recording the address data of the addressing command, send an addressing completion signal to the control module via the communication channel. The control module is further configured to send an inquiry signal to all functional modules via the communication channel, if an addressing completion signal is not received after a predetermined time, and send an addressing command to one of the functional modules with an "incomplete" response. When no "incomplete" response is received within a predetermined period, the control module ends the addressing operation.

In a preferred embodiment of the present invention, the addressing command preferably includes a set of verification codes for confirming that the correctness of the addressing command is not impacted by external interferences during the delivery process. In addition, in the preferred embodiment of the present invention, the initialization command sent by the control module preferably causes specific functional modules, such as functional modules that has not been addressed, or all functional modules, to set their address to a value that indicates an unaddressed status of the functional modules. In addition, in the preferred embodiment of the present invention, the response signal of the functional modules preferably includes an ID code as temporary address of the functional modules during the addressing operation.

In a preferred embodiment of the invention, the communication device may be a wireless communication device and the communication channel is a wireless communication channel. However, in some embodiments of the invention, the communication device is a wired communication device and comprises an electrical connector that provides a plurality of pins for directly or indirectly connecting the pins of adjacent functional modules electrically. In such an embodiment, the communication channel is preferably a bus comprising a plurality of conductive lines. In a particularly advantageous embodiment, the control system comprising the plurality of functional modules further comprises at least one support rail that provides a module support for supporting at least one group of the functional modules in the support rail arranged side-by-side, and a conductive line support for accommodating the plurality of conductive lines of the bus in the support rail. In such an embodiment, the casing of each functional module preferably includes a clamp to clamp the functional module on the support rail. The plurality of the pins may include an initialization signal pin. The plurality of the pins may include two power pins.

In the application example of the present invention, the control module is configured to adjust the value of the address data of all or part of the functional modules according to the addressing result. Each functional module is further configured to: After receiving the addressing command on one side of the photo receiver, pick up the address data contained in the addressing command, record the address as the address of the functional module, and send on the other side of the light emitter a next addressing command to the adjacent functional module of that other side, followed by sending via its communication device an addressing complete signal to the control module to represent the completion of its address.

The next addressing command contains a second address data, which value is a function of first address data value, preferably a cumulative function.

In a preferred embodiment of the present invention, the photo receiver of a functional module adjacent to the control module is disposed on a side adjacent to the control module. The photo emitter is preferably a red light LED emitter.

In a preferred embodiment of the present invention, the bus may further comprise an initialization signal line to be connected by the initialization pin, for controlling the automatic addressing operation. In such an embodiment, the control module is configured to pull the signal level of the initialization signal line to a first level via at least one of its pins, when an automatic addressing is initiated, and to pull the signal level to a second level at end of the addressing operation. Each functional module is further configured to enter the addressing operation, when receiving the first level initialization signal via at least one pin in the electrical connector, and to exit the addressing operation, when receiving the second level initialization signal via at least one pin in the electrical connector. After the second level initialization signal is received, the functional module does not react to the addressing command or does not process any addressing command. In a particular embodiment, the functional module is configured to respond an error message, when a second level initialization signal is received via at least one pin, after an address has not been recorded.

The invention also provides a method for addressing a plurality of functional modules in a control system comprising the plurality of functional modules, and a method for adjusting the addressing result.

The above and other objectives and advantages of the present invention will become more apparent from the following detailed description with reference to the accompanying drawings.

DETAILED DESCRIPTION OF THE INVENTION

In the following, several embodiments of the invented control system comprising a plurality of functional modules and method for addressing the plurality of functional modules will be described using certain preferred embodiments. However, the description of the embodiments of the present invention should not be used to limit the scope of the present invention.

The present invention provides a control system comprising a plurality of functional modules that can automatically address and readdress the functional modules therein, i.e., assigning and reassigning address codes to the functional modules as an address in the system. The present invention also provides a novel automatic addressing method for functional modules in a system comprising the same.

Figure 1:
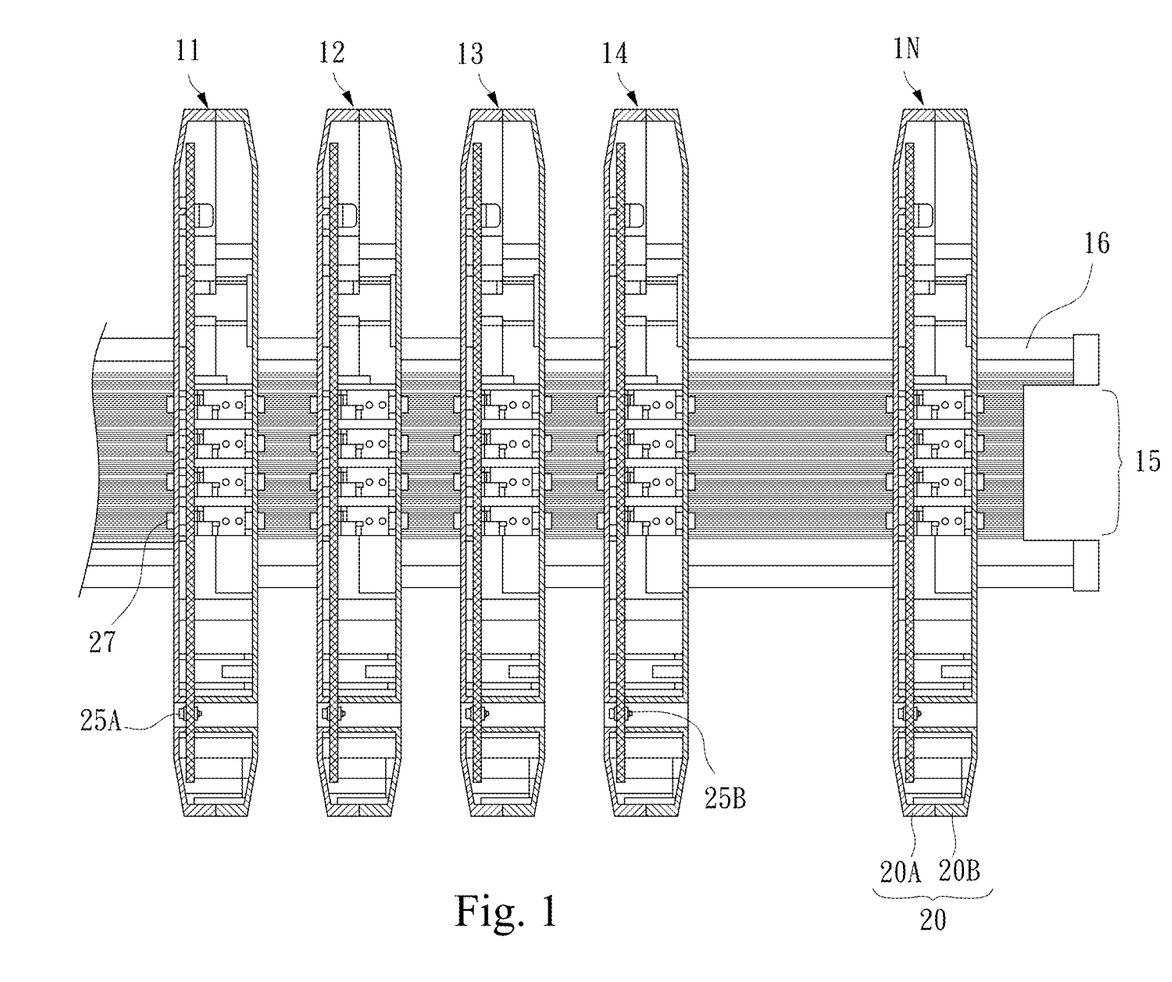
FIG. 1 shows the system diagram of the control system comprising a plurality of functional modules according to an embodiment of the present invention.

FIG. 1 shows a system diagram of the control system comprising a plurality of functional modules according to an embodiment of the present invention. As shown in the figure, the invented system includes a plurality of functional modules 11, 12, 13, 14 . . . 1N. In this system, a control module 11 is included, and the control module 11 and other functional modules 12-1N are mainly connected by a bus 15 and are all allocated at the same level of communication. This type of connection is often referred to as a bus topology or a linear bus. The present invention is certainly not limited to the above-mentioned bus topology; it can be used in, such as, a ring topology or a daisy chain topology.

FIG. 1 shows a gap between each pair of functional modules 11-1N. But this is for the sake of clarity. In the preferred embodiments of the present invention, adjacent two functional modules are in close contact with each other, such that a photo receiver 25A (or photo emitter 25B) on a first side of one functional module is aligned to or in contact with a photo transmitter 25B (or photo receiver 25A) on a second side facing the first side in an adjacent other functional module and that the electrical contacts 27 on the first side of the one functional module are in contact with the electrical contacts 27 on the second side of the adjacent other functional module. If necessary, a clamping mechanism (not shown) can also be provided to clamp two adjacent functional modules so as to ensure a firm and tight contacts between the two.

FIG. 1 also shows that all the functional modules 11-1N are arranged on a support rail 16. A plurality of bus lines is provided on this support rail 16 to form a bus. Although not explicitly shown in the figure, it can be appreciated by referring to FIG. 2 that each functional module is electrically connected to the lines in the bus 15 through a plurality of pins 24. The bus architecture 15 may use, for example, the bus rail and the corresponding pins shown in U.S. Pat. No. 5,716,241. In the example shown in FIG. 1, each functional module 11-1N can share the power, data and control signals travelling on the bus 15. In addition, if the electrical connector 26 to which the electrical contacts 27 belong is the T-shaped electrical connector shown in U.S. Pat. No. 7,704,079, the electrical connectors 26 on all functional modules 11-1N are also connected in series to form a bus system. In such an architecture, each functional module 11-1N can further share power, data and control signals through the connection of the electrical connectors 26.

In addition, the functional modules 11-1N in the system can also be connected through a wireless communication channel. In such an embodiment, each functional module 11-1N may be equipped with a wireless communication device (not shown) to communicate over the wireless channel.

Figure 2:
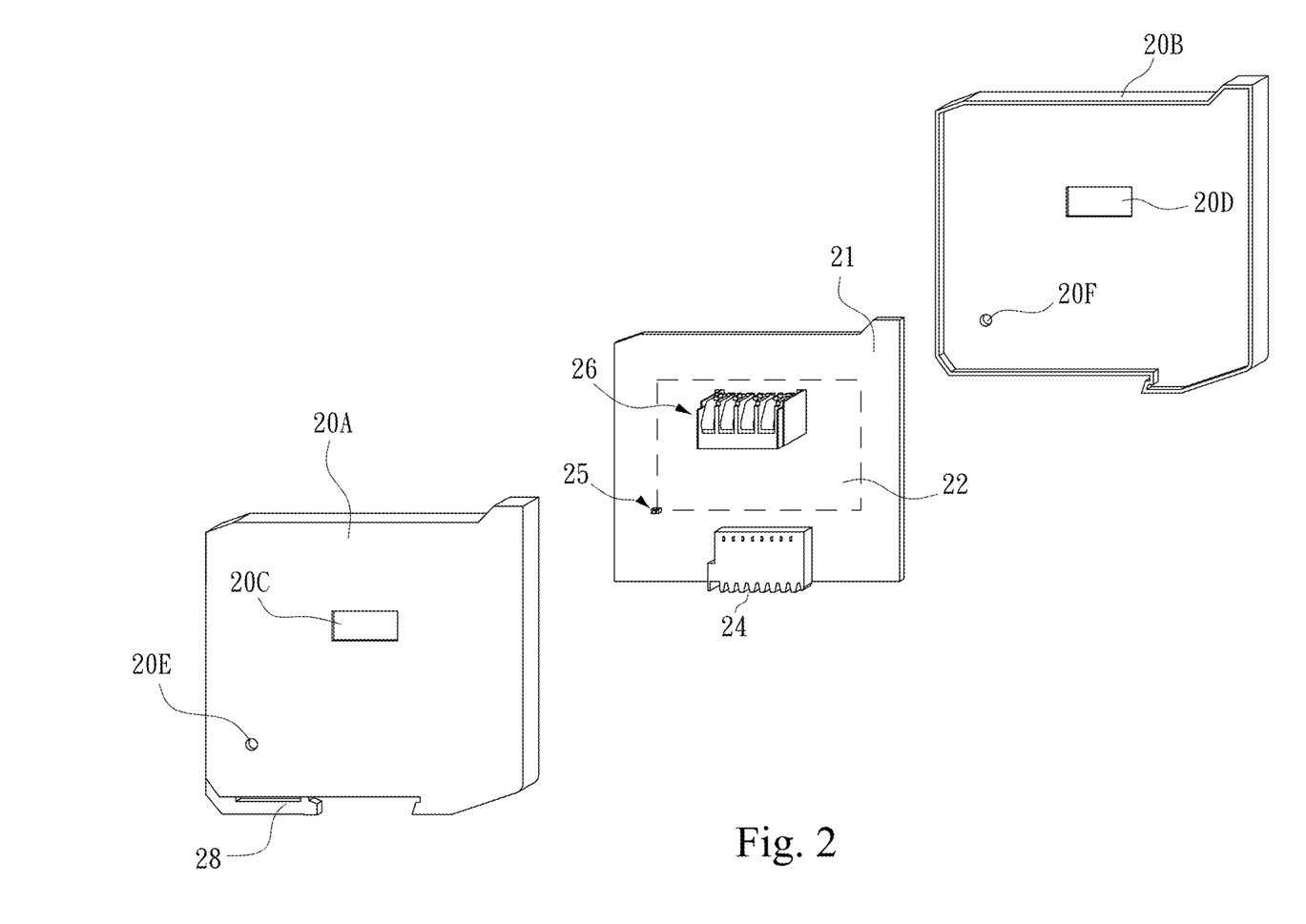
FIG. 2 shows the explosion figure of a functional module applicable to one embodiment of the invented control system comprising a plurality of functional modules.

In the system of the present invention, each functional module 11-1N has the same basic architecture. FIG. 2 shows the schematic diagram of a functional module architecture applicable to an embodiment of the invented control system comprising a plurality of functional modules. As shown in the figure, each functional module 11-1N includes one or more circuit board 21, a first side housing 20A, and a second side housing 20B. The housings 20A and 20B on both sides can be combined into a casing 20, to provide a receiving space therein to accommodate the one or more circuit board 21. Of course, the two-housing structure of the casing 20 is not any technical limitation. The number of the circuit boards 21 included in each functional module 11-1N is also not limited. However, necessary circuitry 22, indicated by the dashed box in FIG. 2, must be provided on the circuit board 21 to provide necessary functions such as input, output, calculation, judgment, control, memory etc. of the functional module.

In a common application example, the circuitry 22 generally includes at least one central processing unit, a memory unit, an input/output control unit, and the like, to receive through connectors 23 provided in the circuitry 22 signals from an external device, and to receive through the electrical connector 26 and/or pins 24 signals from other functional modules (including one control module of the plurality of functional modules 11-1N), and to transmit signals after operations and judgements to the external device (via the connectors 23) and/or to one of the other functional modules including the control module, via the electrical connectors 26 and/or the pins 24, or wirelessly. The number of circuits included in the circuit board 21 of the functional modules 11-1N is not limited to one. The number of circuit boards 21 included in each functional module 11-1N and/or the number and type of circuits in each circuit board 21 may be the same or different. The operational, control etc. functions provided by each functional module 11-1N may be the same or different. Each functional module 11-1N can operate at the same time or separately. Each functional module 11-1N may provide virtually a plurality of operational or controlling modules, while physically forming a single functional module, that is, one accommodated in a single casing 20.

The system in which a plurality of functional modules 1-11N is connected directly in series by the electrical connector 26 to form a bus connection and/or indirect through the lines of a bus, is a typical embodiment of the invented system comprising a plurality of functional modules. Furthermore, a system formed by connecting a plurality of functional modules 11-1N by wireless communication is also applicable to the present invention.

An example of the application of the invented system comprising a plurality of functional modules is the control system for a plurality of working machines in a factory. In such a system, the connectors 23 of a specific functional module may be connected to one or more working machines with control cables (not shown). There may be a plurality of functional modules whose connectors 23 are connected to one working machine, and this one working machine communicates with the one or more work machines through their respectively corresponding functional modules. The connectors 23 of each functional module may also be connected by a master computer, so to receive control commands from the master computer and to feedback execution results of the commands to the master computer. In an ordinary application, one of the plurality of functional modules 11-1N, for example, functional module 11, is a control module, and it has the capability of generating control commands. However, in another application, one of the plurality of functional modules 11-1N, for example, functional module 11 is a control module, and its connectors 23 are connected by a master computer through a control cable. No need to say that the communication between the various functional modules in the system can also adopt a wireless communication channel.

Other configurations and applications of the invented control system comprising a plurality of functional modules are known to those having ordinary skills in the art. Detailed descriptions thereof are thus omitted.

In order to satisfy the needs in the operation or control of the system comprising a plurality of functional modules, the functional module as shown in FIG. 2 may provide a plurality of connection pins on the circuit board 22 for removable connections with signal cables (not shown). The cables may connect external devices such as various working machines or computer devices. The other end of the plurality of connection pins is connected with the circuitry 22, to electrically connect the circuitry 22 with external devices. Of course, it is possible to realize such exchange of information by means of wireless communication.

Each functional module may also provide one or more electrical connectors 26, disposed at a specific position on the circuit board 21 and providing a plurality of electrical contacts 27 for connecting with the corresponding electrical contacts 27 of an electrical connector 26 provided on an adjacent functional module. The other end of the electrical connector 26 is connected with the circuitry 22, so that the circuitry 22 forms electrical connections with the circuitry of adjacent functional modules. The electrical connector 26 is preferably a T-shaped electrical connector as described above, with two shoulders thereof to be electrically connected to adjacent functional modules and one leg connected by the circuitry 22. A plurality of T-shaped electrical connectors is connected in series to form a bus line and the resulted multiple bus lines form a bus system. To facilitate the connection of the electrical connectors 26 of adjacent functional modules, through holes 20C, 20D are opened in corresponding positions of the housings 20A, 20B, so that contacts of the electrical connectors 26 are exposed in the holes 20C, 20D and extend out of the casing 20.

The functional module may also provide one or more pins 24 on one end of the circuit board 21, for electrically connecting the bus lines 15 disposed on the support rail 16. That is, to contact the corresponding electrical contacts 27 in the electrical connectors 26 provided at corresponding positions. The other end of the pin 24 is connected to the circuitry 22, to electrically connect the circuitry 22 with the bus 15. The connecting end of the pin 24 preferably forms a clamping folk, for elastically holding the lines of the bus 15. The plurality of bus lines forms a bus system, other than the bus system formed by the connectors 26. In order to facilitate the connection between the pin 24 and the bus lines, an opening is made in the corresponding end position of the housings 20A, 20B so that the pins 24 are exposed and protrude out of the casing 20. This end of the casing 20 preferably forms a matching shape with the support rail 16 so that the support rail 16 may be engaged in the matching shape. If necessary, an elastic holding member 28 may be further provided to elastically clamp the support rail, after the support rail 16 is inserted and engaged into the matching shape. The clamping situation may be easily released by a user by simply pushing the holding member 28 outwardly.

Although the functional modules shown in FIGS. 1 and 2 simultaneously provide the bus system formed by the electrical connectors 26 and the bus 15 formed by the bus lines on the support rail 16, a person skilled in the art will appreciate that in particular applications, only one of the two can be provided. Even if both are provided at the same time, they may not be used at the same time. However, if the functional modules in the system communicate via a wireless communication channel, it may not be necessary to provide these buses.

A functional module having the above-described structure and functions or a part thereof and a system comprising a plurality of such functional modules are well known in the industry and widely used in industry. Those having ordinary skills in the art are able to realize them according to the known technologies. Details thereof are thus omitted.

Figure 3:
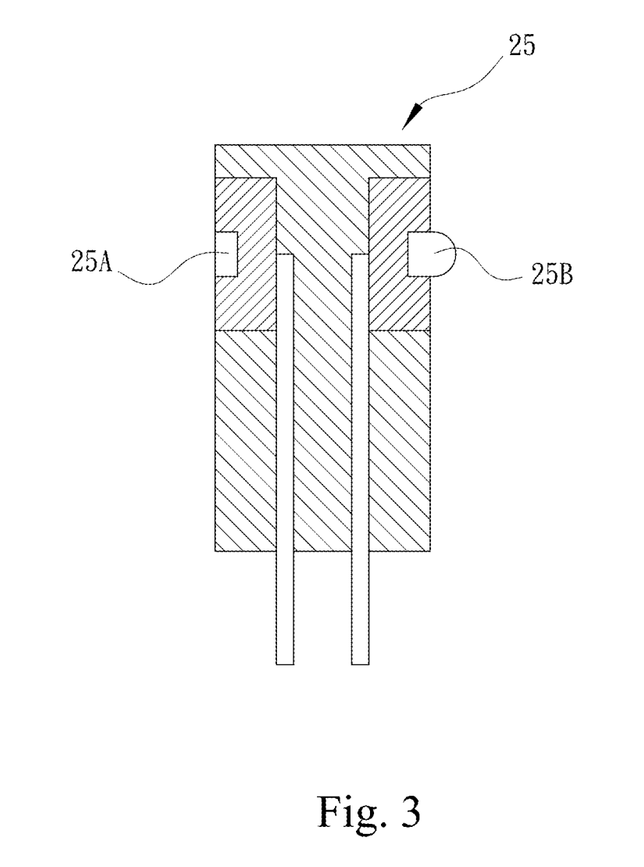
FIG. 3 shows the structural diagram of a photo transceiver suitable for the present invention.

Each functional module 11-1N of the present invention further provides a photo transceiver 25 on the circuit board 21. The photo transceiver 25 includes a photo receiver 25A and a photo emitter 25B, positioned opposite to the photo receiver. FIG. 3 is a structural diagram of a photo transceiver 25 suitable for the present invention. As shown, the photo transceiver 25 includes a photo receiver 25A and a photo emitter 25B, wherein the photo emitter 25B is preferably a red light LED emitter. The receiving/transmitting directions of both substantially align to the same line. The photo transceiver 25 provided in each functional module is located at the said line. Through holes 20E and 20F are opened in corresponding positions on the housings 20A and 20B. When the plurality of functional modules 11-1N is connected in series, the receiving/transmitting direction of all the photo transceivers 25 is aligned substantially to the same line. The photo emitter 25B of one functional module 11 is oriented to the photo receiver 25A of a next functional module 12 on that side, and the photo emitter 25B of the next functional module 12 is oriented to the photo receiver 25A of a further next functional module 12 on that side. In this way, each functional module can use its photo transmitter 25B to send signals to the photo receiver 25A of its adjacent functional module.

It should be noted that in a preferred embodiment of the present invention, the photo emitter 25B of each functional module cannot transmit optical signals circumventing its neighboring functional module to a functional module next to the neighboring one. Therefore, the signal transmission system formed by the photo transceivers 25 is not a bus system. Further, although in the embodiment of FIG. 1, one photo transceiver 25 is provided for each functional module, therefore the formed photo communication system is a unidirectional signal transmission architecture, in some particular embodiments, however, two photo transceivers 25 with reversed photo transmission directions are provided in each functional module, to form a bidirectional signal transmission system. In most applications a unidirectional signal transmission system is sufficient to serve all necessary functions, i.e., the automatic addressing function of the present invention.

As described above, the plurality of functional modules 11-1N includes a control module 11. In the automatic addressing method of the present invention, all the addressing steps are mainly performed by the control module 11. However, the fact that functional module 11 is the control module does not necessarily mean that the functional module 11 is always the control center of all the plural functional modules 11-1N. In addition, the control module 11 does not necessarily need to be located at a specific location of the plurality of functional modules 11-1N, such as a terminal location. However, in the above-mentioned embodiment of the unidirectional photo signal transmission system, the control module 11 is preferably located at the terminal position of the system formed by the plurality of functional modules 11-1N. Specifically, the terminal position denotes to the position of the first photo transmitter in the photo transmission chain formed by the photo transceivers in the system comprising the functional modules 11-1N.

In the following, the automatic addressing method of the system comprising a plurality of functional modules according to the present invention will be described by referring to FIG. 4, which is a flow chart of one embodiment of the automatic addressing method. In the example shown in the figure, the system comprising a plurality of functional modules includes three functional modules, i.e., a control module 11, a first slave functional module 12 and a second slave functional module 13. However, the invented addressing method can be applied in a system including any number of functional modules. In addition, in the embodiment of FIG. 4, only the bus 15 provided on the support rail 16 is used, and the bus formed by the electrical connectors 26 is not used. This, of course, is not any technical limitation. The bus 15 may include 4 power lines (e.g., 24V+− and 5V+−), an initialization signal line, and 2 signal lines. However, it is known to those skilled in the art that the automatic addressing method of the present invention can also be achieved by using only the bus system formed by the connectors 26 in series, or by wireless communication.

Figure 4:
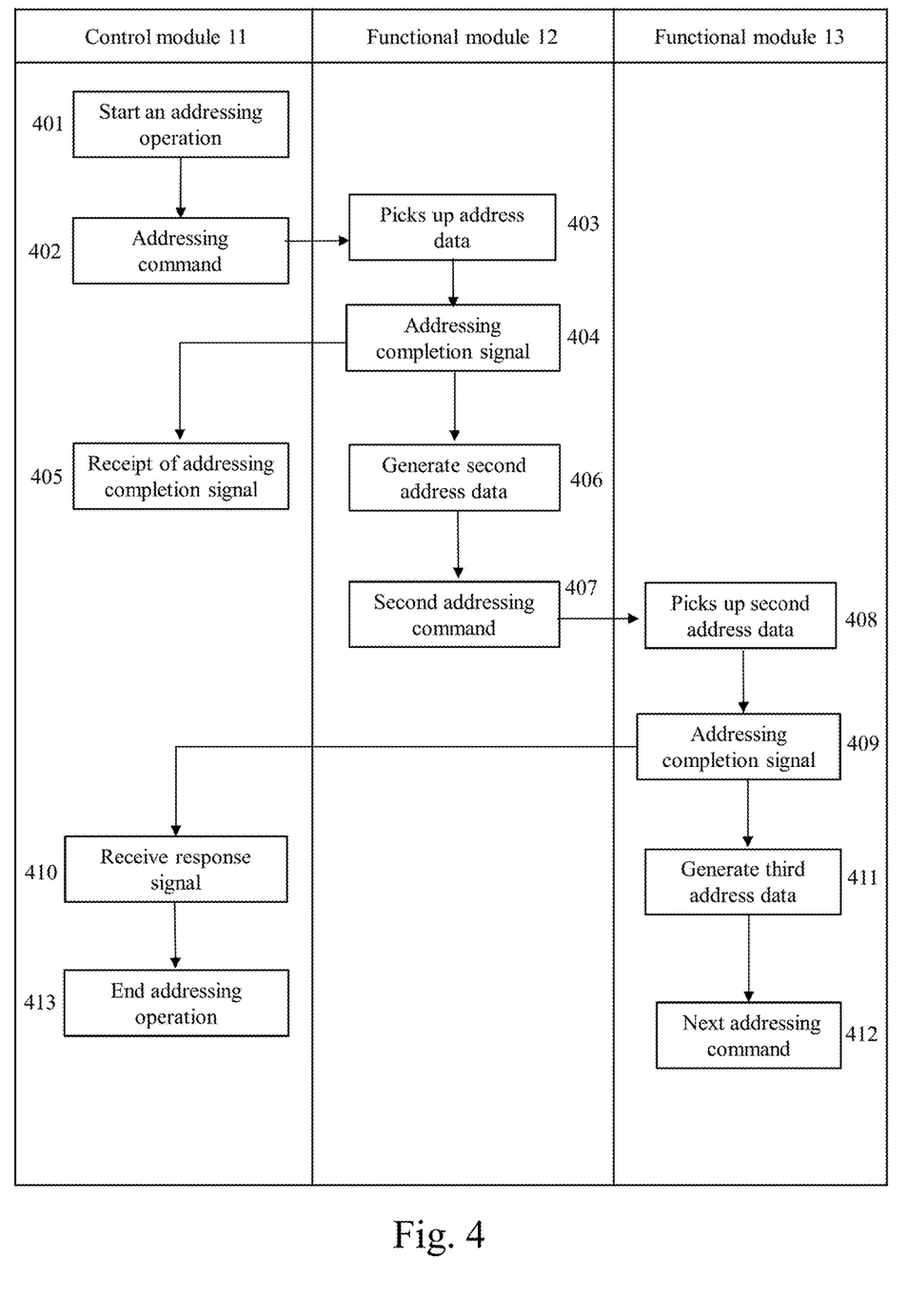
FIG. 4 shows the flowchart of a method for addressing a plurality of functional modules in a system comprising the plurality of functional modules according to one embodiment of the present invention.
Figure 5:
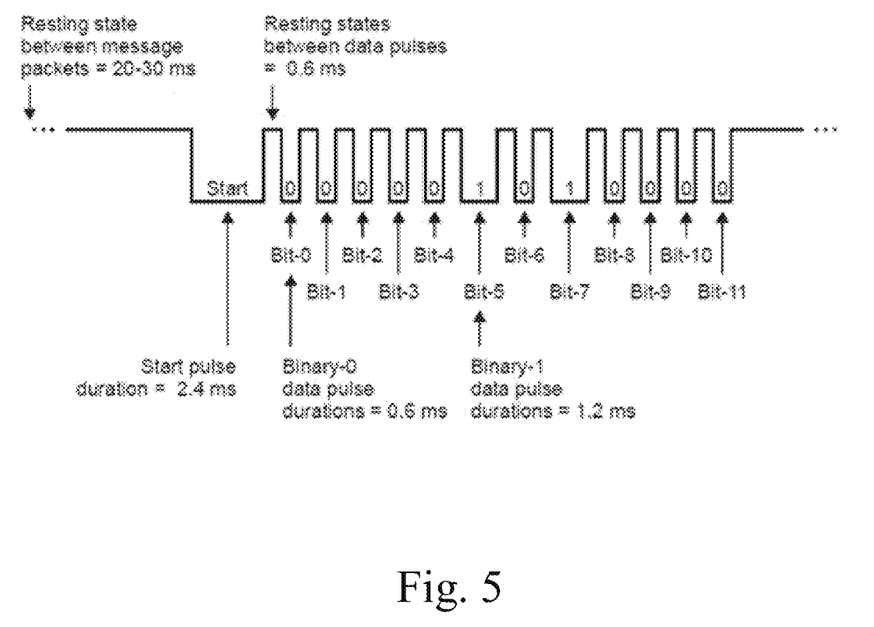
FIG. 5 shows a schematic diagram of an optical signal encoding method used in the present invention.

As shown in FIG. 4, in step 401, the control module 11 enters an addressing or re-addressing operation. Therefore, the control module 11 sets the signal on the initialization signal line of bus 15 from a second level to a first level, such as, pulling from a low level to a high level, to cause the other functional modules to initialize the addressing operation. In application, each functional module 11-1N may be configured to enter an addressing operation when receiving the high-level initialization signal, and to exit the addressing operation, i.e., not to react to a photo signal received from its photo receiver, after receiving the low-level initialization signal. Of course, those having ordinary skills in the art would appreciate that the system can also be configured to pull the signal on the initialization signal line from a high level to a low level to initialize the addressing operation. In other words, the first level and the second level are the selectable combination of a high level and a low level. In addition, in an embodiment equipped with a wireless communication device, the control module 11 can send an initialization signal to enter an addressing or re-addressing operation, which causes each functional module 11-1N to enter the addressing or re-addressing operation. In a preferred embodiment of the present invention, when receiving the first level initialization signal, each functional module may first set its own address to a predetermined value, for example, #31, to indicate that the functional module has not been assigned an address.

Thereafter, in step 402, the control module 11 sends an addressing command (first addressing command) to its downstream adjacent functional module 12 via its photo transmitter 25B. The addressing command contains a unique address data (the first address data). Preferably, the addressing command further includes a set of verification codes for confirming that the correctness of the addressing command was not impacted by external interferences during the transmission process. The verification code may be a result of calculation based on the addressing command, such as an address value, etc., and is provided along with the addressing command.

The functional module that issues the addressing command, such as the control module 11, generates the verification code by the same calculation method as the functional module that receives the addressing command, for example, functional module 12. If the content of the message is correct, the verification code generated by the sender functional module would be the same as the one calculated by the receiver functional module of the addressing command.

In step 403, the photo receiver 25A of the slave functional module 12 detects the optical signal emitted by the photo transmitter 25B of the control module 11 and determines the optical signal is an addressing command. The functional module 12 determines that the initialization signal is in the first level. It thus picks up the first address data from the first addressing command, and recording the address as the new address of the functional module 12. In this step, no other functional module 13-1N receives the first addressing command.

In step 404, the first slave functional module 12 sends an addressing completion signal representative of the completion of addressing to the control module 11. In a preferred embodiment of the invention, the addressing completion signal is transmitted through the bus 15, designating the control module 11 as receiver. Of course, it is also possible to transmit the signal via the bus system formed by the electrical connectors 26 or via a wireless communication channel. The addressing completion signal preferably includes an ID code that represents the functional module 12. In application, the ID code can be a code assigned to the functional module 12 at the factory, and the code is unique so that no two devices in the world use the same code. This code may include information representing the manufacturer, the model number, the date of manufacture, and/or the serial number. After receiving the addressing completion signal of the functional module 12, the control module 11 stores the first address data, the ID code of the functional module 12, and the serial number of the functional module 12 in step 405. The serial number (for example, unit number 01) is recorded.

Immediately after step 404, the functional module 12 performs a certain calculation on the first address data in step 406, to generate a second address data which is also a unique value, and attaches the second address data to an addressing command (second addressing command). The second addressing command is sent to the adjacent functional module 13 on the downstream side via the light emitter 25B of the functional module 12 in step 407. In a preferred embodiment of the present invention, the value of the second address data is a function of the first address data value. One suitable function is accumulation. For example, if the first address value sent by the control module 11 is 01, the value of the second address data may be the result of adding 1 to the value of the first address data, that is, 02. Other methods that can automatically generate an address value may also be applied to the present invention. In step 408, the photo receiver 25A of the slave functional module 13 detects the optical signal emitted by the light emitter 25B of the upstream functional module 12, and determines it an addressing command. The functional module 13 further determines that the initialization signal level is at a high level, therefore, picks up the second address data from the addressing command and recorded it as the new address of the functional module 13. Similarly, no other functional modules 12, 14-1N receives the second addressing command in this step.

In step 409, the functional module 13 sends an addressing completion signal representative of the completion of the addressing to the control module 11. The functional module 13 generates a next addressing command in step 411 and provides it to its downstream via its photo transmitter 25B at 412. Similarly, this addressing command contains a next address data, and the value of the next address data is a function of the third address data, for example, accumulating. In this embodiment, it can be 03, and so on. Immediately after step 409, the control module 11 receives the response signal of the functional module 13 in step 410, and records the ID code and the new address of the functional module 13 (02, replacing the original address of #31) and series No. These addressing steps are repeated until the addressing is completed. In the example of FIG. 4, there is no further functional module on the downstream side of functional module 13. The optical signal transmitted by the functional module 13 is not receivable by any other functional module. Therefore, the third addressing command will not be picked up by any functional module. As a result thereof, no functional module will send a response signal representative of completion of the addressing. In step 413, the control module 11 does not receive any response signal within a predetermined time after sending the third addressing command. It determines that the addressing operation has been completed. Therefore, the level of the initialization signal line is pulled low (second level). This concludes the addressing operation.

The pulse length modulation technique may be used in this invention to transmit the addressing commands that contain address data in the form of an optical signal. The length of the optical signals may be used to represent a resetting state, start state or 0 or 1 pulse. Other techniques that can be applied to optical signal transmission are also applicable to the present invention.

In an embodiment of the present invention, each functional module 12-1N is configured to determine whether a new address has been assigned to it, when it detects a second level initialization signal. If the result is NO, an error message is returned to the control module 11. The control module 11 can once again pull the initialization signal level to the first level for re-addressing operation. The procedure for re-addressing is basically the same as described above. Detailed descriptions thereof are thus omitted. The timing of this determination is preferable set to when the level of the initialization signal line is pulled from the first level to the second level on time. One suitable method is to configure the central processing unit of each functional module 12-1N to generate an interrupt when the level of the initialization signal line is pulled from the first level to the second level. This allows the central processing unit to instantly check whether the associated functional module has acquired a new address. A skilled person would appreciate that there are many other possible ways of doing this.

According to the present invention, the invented automatic addressing method is used in a system having the above architecture, and the method comprises the following steps:

a. The control module sends an initialization command to cause all functional modules to enter the addressing operation;

b. The control module sends a first addressing command to its downstream adjacent functional module of one side via its photo transmitter, the addressing command containing unique address data;

c. The initialization command and the addressing command cause the neighboring functional module to receive the first addressing command, pick up the address data, and record the address as the address of the neighboring functional module;

d. The adjacent functional module sends a second addressing command to the downstream adjacent functional module of the one side via its photo transmitter and returns an addressing completion signal to the control module; the second addressing command includes another unique address data and the value of the second address data is a function of the first address data value.

Repeat the above steps c. to d. until all functional modules have been addressed: and The control module sends an initialization command again, so that all functional modules exit the addressing operation.

Preferably, to start the addressing operation the control module generates the initialization command by pulling the signal level of the initialization signal line from a second level to a first level, and to exit the addressing operation the control module pulls the signal level to the second level. In this embodiment, the step of receiving an addressing command by each functional module may include the following steps: determining a signal level of the initialization signal line after receiving the addressing command, picking up the address data if the signal level is the first level; and picking up no address data if the signal level is the second.

The addressing command preferably includes a set of verification codes for confirming the correctness of the addressing command. The initialization command issued by the control module preferably sets for specific functional modules, such as an unaddressed functional module, or all functional modules, an address that represents that modules with the address are not designated a new address. In addition, the signals returned by the functional modules to the control module preferably include an ID code that may be used as a temporary address of the functional modules during the addressing operations.

In addition, when a functional module determines the initialization signal is pulled from the first level to the second level, it determines whether a new address has been assigned to it. If the determination is negative, the functional module returns an error message to the control module.

Although the foregoing method provides a very simple and convenient method for automatically addressing a plurality of functional modules, however, as described above, in case not all of the functional modules are properly arranged on the rail, with their individual light emitters aligned correctly to the downstream side photo receivers, the addressing operation of the functional modules may interrupt and cannot automatically resume.

In order to solve such a problem, the present invention provides a method for automatically addressing a plurality of functional modules that can automatically resume the addressing operation when interrupted. FIG. 6A to 6D are flow charts showing an embodiment of the addressing method for a plurality of functional modules with automatic trouble-shooting functions of the present invention. As shown, in step 601, FIG. 6A, the control system comprising a plurality of functional modules of the present invention has assigned addresses to functional modules 12, 13, 14, with unit numbers/addresses 01, 02, and 03. As no functional module is arranged adjacent to functional module 14, address 03, on the downstream side, no functional module will return an addressing complete signal in response to the addressing command generated by functional module 14, address 03. The addressing operation is thus ended by the control module 11, address 00. However, as shown in this FIG. 6A, the control system contains 8 functional modules 11-14, 15-18. The downstream functional module 15 following the functional module 14, address 03, cannot receive the addressing command issued by functional module 14, because it is not adjacent to the functional module 14 of address 03. The above addressing operation remains the addresses of the four functional modules 15-18 following functional module 14 still 31, that is, unaddressed.

There are many reasons for this result. One possible reason is that the functional module (not shown) arranged immediately after unit number 03 is malfunctioned, leaving the functional module that caused the failure together with all downstream functional modules unaddressed.

In order to solve this problem, in the preferred embodiment of the present invention, the control module 11 (for example, unit number 00 in FIG. 6A) is further configured to: After the addressing operation is ended, sending an inquiry signal to all the functional modules 11-1N to prompt each functional module to reply its own address data. Preferably, the information returned by each functional module 11-1N includes the ID code, so that the control module 11 can determine how many functional modules are still not addressed. Alternatively, the control module 11 may be configured to send the inquiry signal to all the unaddressed functional modules, e.g., all functional modules with the address of 31, only.

Thereafter, the control module 11 determines that there are still four functional modules not assigned an address. The control module then sends an addressing command to one of four functional modules determined pursuant to given rules. In this step, the addressing command is not transmitted via the photo transmitter, but via the bus 15, the bus system formed by the connectors 26 or the wireless communication channel. In addition, the inquiry signal of the control module 11 and the reply of each functional module in the previous step are also transmitted via one of the above channels, not via the optical transceiver. The rule that determines a functional module to receive the reassuming addressing command can be any rule. In a preferred embodiment of the invention, the rule is a random selection, while other methods of determining a functional module to receive the addressing command can be used in the present invention.

Figure 6A:
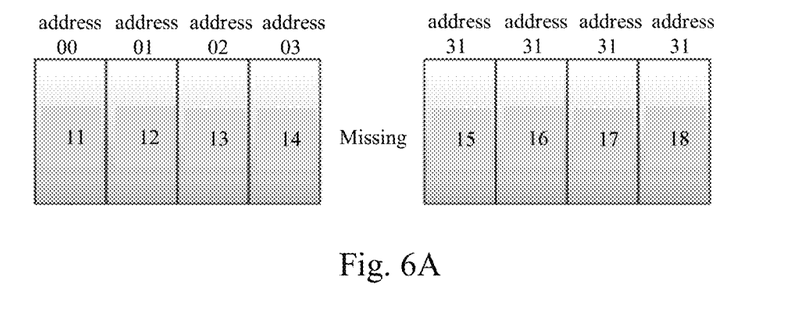
FIG. 6 is a flow chart showing an embodiment of the invented method for addressing plural functional modules with an automatic trouble-shooting function.
Figure 6B:
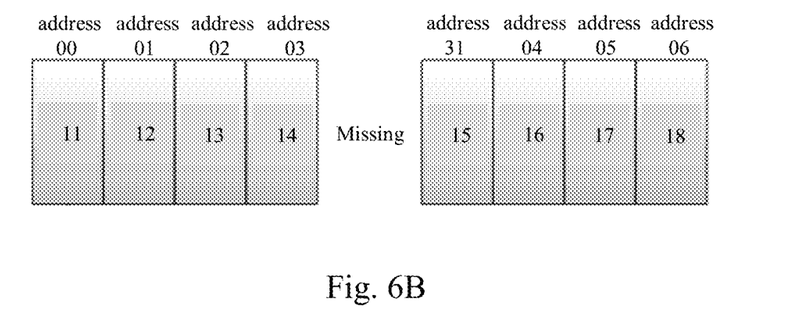

In this step, as shown in FIG. 6B, the addressing command is received by the third from last functional module, i.e., functional module 16. Upon receipt of the addressing command, the functional module 16 executes the addressing method of the present invention and records the address data contained in the addressing command as its own address in the system. This address is also generated as a function of the last address given in the previous addressing operation but is calculated by the control module 11. For example, in the previous addressing operation, the last address is 03, assigned to functional module 14. If the function is accumulation, then the addressing command issued by the control module 11 in this step contains the address of 04.

After recording the address data, the functional module 16 returns an addressing completion signal to the control module 11. The functional module 16 then generates a next address data according to the above-described rules, for example, accumulation, followed by including the next address data in a next addressing command, and transmitting the addressing command via its photo transmitter to the adjacent functional module 17 on the downstream side.

Figure 6C:
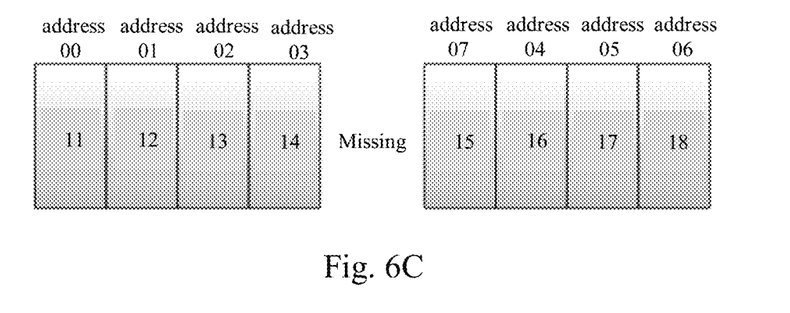

Thereafter, functional modules 17, 18 are all assigned an address 04-06, according to the above steps. The control module 11 determines that the addressing operation has been completed, when no addressing completion signal is received within a predetermined time after the functional module 18 completes the addressing. The control module 11 thus determines the system to exit the addressing operation. However, in a preferred embodiment of the present invention, the control module 11 is configured to send an inquiry signal to all the functional modules 11-1N or to the functional modules that it determined not having been assigned an address in the previous addressing operation, in which case the functional module 15 that stills has the unit number/address of 31. Upon receipt of a return message from the unaddressed functional module 15, the control module 11 sends an addressing command that contains a next address of 07 to functional module 15, see FIG. 6C. The addressing results are also shown in FIG. 6C.

After the functional module 15 has completed the addressing, an addressing command containing a further next address data is transmitted to the functional module 16. However, the functional module 16 has been given an address, therefore its address is not 31 anymore. The functional module 16 will not update the address, but will still send an addressing completion signal to the control module 11. Nor will the functional module 16 send a next addressing command to the downstream functional module 17. This completes the addressing of all functional modules. After the addressing operation, all functional modules are given a unique address.

Figure 6D:
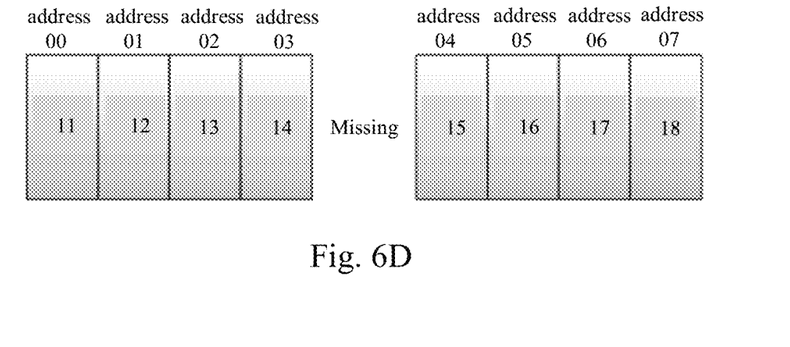

The control module 11 sends an inquiry signal to confirm that there is no functional module returning an address of 31, based on which it determines that the addressing operation is completed. An initialization signal is generated, for example, by pulling the signal level of the initialization line from the first level to the second level, to cause all functional modules to exit the addressing operation. Thereafter, if necessary, the control module 11 can also subtract the address values of related functional modules by the values of the vacant addresses, after a re-addressing operation, so that all the functional module would have consecutive address values, see FIG. 6D.

In summary, the method for addressing a plurality of functional modules with a trouble-shooting function of the present invention further comprises the following steps:

e. After completing an addressing operation, an inquiry signal is sent to all functional modules, and a response signal of the unaddressed functional module is received.

f. Select an unaddressed functional module according to a given rule, and provide an addressing command containing a next address data to the selected functional module. The addressing command is sent through the communication device. The given rule can be a random selection. The value of the next address data is a function of the address data value previously assigned by the system.

g. The selected functional module records the address data contained in the addressing command as its address in the system, and sends an addressing completion signal to the control module. The addressing completion signal preferably includes an ID code which is used as a temporary address during the coding operation.

h. Repeat steps e to g until all functional modules have been assigned an address.

As described above, the present invention provides a novel architecture for a control system comprising a plurality of functional modules having, and an automatic addressing method for the plurality of functional modules. Due to the use of the photo signal architecture, the functional modules in the invented system can efficiently transmit addressing commands without using a clamp means. The resulting functional modules are easy to install and detach. After adding or removing a functional module, the system can be easily addressed or re-addressed at any time. High efficiency in system control is thus achieved. In addition, the present invention also provides a method for addressing plural functional modules with a trouble-shooting function. When the addressing operation is interrupted for different reasons, the method can automatically resume the addressing operation until all functional modules have been assigned an address.

What is claimed is:

1. A control system comprising a plurality of functional modules, comprising at least one group of plural functional modules arranged side-by-side, wherein each functional module comprises at least one circuit, a casing for accommodating at least a part of the circuit, a communication device in electrical connection with the circuit and in communication connection with a communication channel connected by all the functional modules, and a photo transceiver comprising a photo receiver and a photo transmitter, respectively provided on the sides of the casing, for transmission of optical signals to and from a photo transmitter and a photo receiver on corresponding sides of the casing of adjacent functional modules;

wherein, the plurality of functional modules includes a control module, configured to send from its communication device an initialization command to all functional modules via the communication channel, an initialization command causing all functional modules entering an addressing operation, and to send a first addressing command to a first functional module adjacent to a downstream side of the control module via its photo transmitter, after entering the addressing operation;

wherein the first addressing command comprises a unique first address data, and causes the first functional module to receive the first address data, record the address as the address of the first functional module, and send a second addressing command to a second functional module adjacent to the first functional module at the downstream side via its photo emitter;

wherein the second addressing command includes a unique second address data, and causes the second functional module to receive the second address data, record the address as the address of the second functional module, and send a next addressing command to an adjacent functional module in the downstream side via its photo emitter;

wherein the value of the second address data is a function of the first address data value, and the value of the next address data is a function of the second address data value; and wherein each functional module is configured to, upon receipt of an addressing command, receive address data contained in the addressing command, record the address as its address, and send a next addressing command to a downstream functional module adjacent to the functional module at the downstream side via its photo emitter, wherein the next addressing command contains a next address data that is a function of the received address data; and after recording the address data of the addressing command, to send an addressing completion signal to the control module via the communication channel; and wherein the control module is further configured to end the addressing operation, if no addressing completion signal is received after a predetermined time.

2. The control system of claim 1, wherein the control module is further configured to send an inquiry signal to all functional modules via the communication channel to cause a functional module not yet assigned an address to return an "incomplete" response, if an addressing completion signal is not received after a predetermined time, and send an addressing command to one of the functional modules that return an "incomplete" response; and to end the addressing operation, when no "incomplete" response is received within a predetermined time.

3. The control system of claim 2, wherein each functional module is configured to return a response signal in response to the inquiry signal of the control module, wherein the response signal includes an ID code used as a temporary address during a coding operation.

4. The control system of claim 1, wherein each functional module is configured to: after receiving an addressing command on one side of the photo receiver, pick up the address data contained in the addressing command, recorded as the address of the functional module, and send a next addressing command to the adjacent functional module on the other side of the light transmitter, and send an addressing completion signal indicating a completion of the addressing operation via the communication device to the control module.

5. The control system of claim 1, wherein the function is accumulation.

6. The control system of claim 1, wherein the addressing command further comprises a set of verification codes for confirming the correctness of the addressing command.

7. The control system of claim 1, wherein the initialization signal generated by the control module sets the address of functional modules not been assigned an address value to represent a status of not been assigned an address.

8. The control system of claim 1, wherein the communication device is a wireless communication device and the communication channel is a wireless communication channel.

9. The control system of claim 1, wherein the communication device is a wired communication device and includes an electrical connector that provides a plurality of pins for directly or indirectly connecting the pins of adjacent functional modules electrically.

10. The control system of claim 9, wherein the communication channel is a bus comprising a plurality of conductive lines.

11. The control system of claim 10, further comprising at least one support rail that provides a module support for supporting at least one group of the functional modules arranged side-by-side in the support rail, and a conductive line support for accommodating the plurality of conductive lines of the bus in the support rail.

12. The control system of claim 11, wherein the casing of each functional module preferably includes a clamp to clamp the functional module on the support rail.

13. The control system of claim 10, wherein:
the bus further comprises an initialization signal line for controlling the automatic addressing operation;
the control module is configured to pull the signal level of the initialization signal line to a first level, when an addressing operation is initiated, and to pull the signal level to a second level at end of the addressing operation; and
each functional module is further configured to enter the addressing operation, when receiving the first level initialization signal via at least one pin in the electrical connector, and to exit the addressing operation, when receiving the second level initialization signal via at least one pin in the electrical connector.

14. The control system of claim 13, wherein each functional module is configured to check whether it is assigned an address, when detecting the second level initialization signal; and, if not, send an error message to the control module.

15. The control system of claim 1, wherein the control module is further configured to adjust the value of an address data of all or part of the functional modules according to an addressing result.

16. The control system of claim 1, wherein the light emitter is a red light LED emitter.

17. A method for addressing a plurality of functional modules in a control system comprising the plurality of functional modules,
wherein the control system comprises at least one group of plural functional modules arranged side-by-side, each functional module comprising at least one circuit, a casing for accommodating at least a part of the circuit, a communication device in electrical connection with the circuit and in communication connection with a communication channel connected by all the functional modules, and a photo transceiver comprising a photo receiver and a photo transmitter, respectively provided on the sides of the casing, for transmission of optical signals to and from a photo transmitter and a photo receiver on corresponding sides of the casing of adjacent functional modules; wherein the plurality of functional modules includes a control module;
the method comprising the following steps:
a. after entering into an addressing operation, the control module sending a first addressing command to its downstream adjacent functional module of one side via its photo transmitter, the addressing command containing unique address data;
b. the adjacent functional module receiving the first addressing command, picking up the address data, and recording the address as the address of the neighboring functional module;

c. the adjacent functional module sending a next addressing command to a downstream adjacent functional module of the one side via its photo transmitter and returning an addressing completion signal to the control module; the next addressing command including another unique address data which is a function of the first address data value;

repeating the above steps b and c, until all functional modules have been assigned an address, whereby the addressing operation is completed.

18. The method of claim 17, further comprising the following steps:
  e. the control function sending, after completing an addressing operation, an inquiry signal to all functional modules, for a response signal of the unaddressed functional module;
  f. the control module electing an unaddressed functional module according to a given rule, and providing an addressing command containing a next address data to the selected functional module; wherein the addressing command is sent through the communication device and wherein a value of the next address data is a function of the address data value previously assigned;
  g. the selected functional module recording the address data contained in the addressing command as its address in the system, and sending an addressing completion signal to the control module; and
  h. Repeating steps e to g, until all functional modules have been assigned an address.

19. The method of claim 18, wherein the function is accumulation.

20. The method of claim 18, wherein each of the functional modules returns a response signal in response to the inquiry signal of the control module, wherein the response signal includes an ID code used as a temporary address during a coding operation.

21. The method of claim 17, wherein the function is accumulation.

22. The method of claim 17, wherein the addressing command further comprises a set of verification codes for confirming the correctness of the addressing command.

23. The method of claim 17, wherein the addressing operation is initiated by the control module by sending an initialization signal to set the address of functional modules not been assigned an address value to represent a status of not been assigned an address.

24. The method of claim 17, wherein the communication device is a wireless communication device and the communication channel is a wireless communication channel.

25. The method of claim 17, wherein the communication device is a wired communication device and includes an electrical connector that provides a plurality of pins for directly or indirectly connecting the pins of adjacent functional modules electrically.

26. The method of claim 25, wherein the communication channel is a bus comprising a plurality of conductive lines and wherein the control system further comprises at least one support rail that provides a module support for supporting at least one group of the functional modules arranged side-by-side in the support rail, and a conductive line support for accommodating the plurality of conductive lines of the bus in the support rail.

27. The method of claim 26, wherein
  the bus further comprises an initialization signal line for controlling the automatic addressing operation;
  the control module is configured to pull the signal level of the initialization signal line to a first level, when an addressing operation is initiated, and to pull the signal level to a second level at end of the addressing operation; and
  each functional module is further configured to enter the addressing operation, when receiving the first level initialization signal via at least one pin in the electrical connector, and to exit the addressing operation, when receiving the second level initialization signal via at least one pin in the electrical connector.

28. The method of claim 27, further comprising the step of: each functional module checking whether a new address data is obtained when detecting the second level initialization signal; and, if not, returning an error message to the control module.

* * * * *